US011280816B2

(12) United States Patent
Natsumeda et al.

(10) Patent No.: US 11,280,816 B2
(45) Date of Patent: Mar. 22, 2022

(54) DETECTING ANOMALIES IN A PLURALITY OF SHOWCASES

(71) Applicant: NEC Laboratories America, Inc., Princeton, NJ (US)

(72) Inventors: Masanao Natsumeda, Princeton Junction, NJ (US); Wei Cheng, Princeton Junction, NJ (US); Haifeng Chen, West Windsor, NJ (US)

(73) Assignee: NEC CORPORATION

( * ) Notice: Subject to any disclaimer, the term of this patent is extended or adjusted under 35 U.S.C. 154(b) by 257 days.

(21) Appl. No.: 16/380,378

(22) Filed: Apr. 10, 2019

(65) Prior Publication Data

US 2019/0324068 A1 Oct. 24, 2019

Related U.S. Application Data

(60) Provisional application No. 62/660,321, filed on Apr. 20, 2018.

(51) Int. Cl.
*G01R 21/133* (2006.01)

(52) U.S. Cl.
CPC .................................. *G01R 21/133* (2013.01)

(58) Field of Classification Search
CPC .. G01R 21/133; G01R 31/2825; G01R 31/56; H04L 63/1425; G06N 20/00; G06N 7/005; G06N 3/0445; G06N 3/0454; G06N 3/08; G06N 3/084; G05B 23/024; G05B 23/0254; G06F 11/0793; G06F 11/079

See application file for complete search history.

(56) References Cited

U.S. PATENT DOCUMENTS

| 2004/0210419 | A1* | 10/2004 | Wiebe .................. F25B 49/005 702/182 |
| 2013/0340457 | A1 | 12/2013 | Keres et al. |
| 2017/0169357 | A1* | 6/2017 | Caspi ....................... G06N 3/08 |
| 2018/0031259 | A1* | 2/2018 | Fujisawa ................ G05B 15/02 |
| 2018/0087790 | A1* | 3/2018 | Perez ........................ F24F 11/56 |
| 2018/0137462 | A1* | 5/2018 | Zohar ................ G06Q 10/0875 |
| 2018/0306476 | A1* | 10/2018 | Brady ................. G05B 23/0235 |

(Continued)

OTHER PUBLICATIONS

Santana, "Machine Learning Application for Refrigeration Showcase Fault Discrimination", 2016 IEEE Region 10 (TENCON), Nov. 2016, pp. 10-13.

(Continued)

*Primary Examiner* — Yoshihisa Ishizuka
*Assistant Examiner* — Carter W Ferrell
(74) *Attorney, Agent, or Firm* — Joseph Kolodka (57) ABSTRACT

Systems and methods for detecting anomalies in a plurality of showcases are provided. A system can obtain a corresponding table between each of the plurality of showcases and at least one corresponding sensor. The system obtains information for showcase clustering. The system can include a processor device that can determine at least one cluster of showcases based on the information for showcase clustering and the corresponding table between each of the plurality of showcases and the at least one corresponding sensor. The system can build at least one model for each of the at least one cluster of showcases and detect at least one anomaly based on data from the at least one cluster of showcases and the at least one model.

20 Claims, 5 Drawing Sheets

(56) References Cited

U.S. PATENT DOCUMENTS

2019/0057317 A1* 2/2019 Malhotra ............... G06N 7/005
2019/0286506 A1* 9/2019 Cheng .................... G06N 3/088

OTHER PUBLICATIONS

Li, "A Data-Driven Strategy for Detection and Diagnosis of Building Chiller Faults Using Linear Discriminant Analysis", Energy and Buildings, vol. 128, Jul. 2016, pp. 519-529.
Srivastava, "Unsupervised Learning of Video Representations Using LSTMs", Proceedings of the 32nd International Conference on Machine Learning, vol. 37, Feb. 2015, pp. 843-852.
Sharma, "Fault Detection and Localization in Distributed Systems Using Invariant Relationships", The 43rd Annual IEEE/IFIP International Conference on Dependable Systems and Networks, Jun. 2013, 8 pages.
MacGregor, "Statistical Process Control of Multivariate Processes", Control Eng. Practice, vol. 3, No. 3, Jan. 1995, pp. 403-414.

* cited by examiner

DETECTING ANOMALIES IN A PLURALITY OF SHOWCASES

RELATED APPLICATION INFORMATION

This application claims priority to U.S. Provisional Patent Application No. 62/660,321, filed on Apr. 20, 2018, incorporated herein by reference herein its entirety.

BACKGROUND

Technical Field

The present invention relates to cooling device monitoring and more particularly to detecting anomalies in the refrigeration showcases.

Description of the Related Art

Refrigeration showcases, chillers and refrigerators are important equipment in retail stores. Their improper use may greatly increase their electric utility cost. This cost can be huge since the electric utility cost of operating refrigeration showcases is often a half (or more) of the electric utility cost in a store. In addition, opportunity loss is incurred whenever the showcases stop their services due to a failure. Early anomaly detection is important to reduce those losses.

SUMMARY

According to an aspect of the present invention, a method is provided for detecting anomalies in showcase. The method includes obtaining a corresponding table between each of the showcases and at least one corresponding sensor and obtaining information for showcase clustering. The method also includes determining, by a processor device, at least one cluster of showcases based on the information for showcase clustering and the corresponding table between each of the showcases and the at least one corresponding sensor. The method further includes building at least one model for each of the at least one cluster of showcases and detecting at least one anomaly based on data from the at least one cluster of showcases and the at least one model.

According to another aspect of the present invention, a system is provided for detecting anomalies in showcases. The system includes a processor device operatively coupled to a memory device. The processor device is configured to obtain a corresponding table between each of the showcases and at least one corresponding sensor and obtain information for showcase clustering. The processor device is further configured to determine at least one cluster of showcases based on the information for showcase clustering and the corresponding table between each of the showcases and the at least one corresponding sensor. The processor device is also configured to build at least one model for each of the at least one cluster of showcases, and detect at least one anomaly based on data from the at least one cluster of showcases and the at least one model.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

In accordance with the present invention, systems and methods are provided for fault detection in clustered showcases rather than individual showcases. The various embodiments build clusters of showcases and then builds a model for each cluster with multi-variate time series data to learn data properties over normally running periods. Using the model, the various embodiments keep monitoring system status by checking the reconstruction error from the model. When the error becomes large, the embodiments provide an alert to report a failure of the showcase(s).

Embodiments disclosed herein reduce the uncertainty of models for detecting anomalies by considering only similar or dependent showcases together. The various embodiments can find robust features for anomaly detection among attributes and/or parameters associated with the showcases. As a result, the embodiments reduce influence from noise, dynamics or both in time series data. The dynamics in time series data from the showcases can include non-stationary process with sudden change during normal status of the showcases. The noise in time series data from the showcases can include meaningless information and/or information that cannot be interpreted. The models can be used to identify features (or attributes) in the data sets that are most relevant to determining an accurate prediction of the behavior of the showcases and deviations from this behavior (for example, anomalies).

Figure 1:
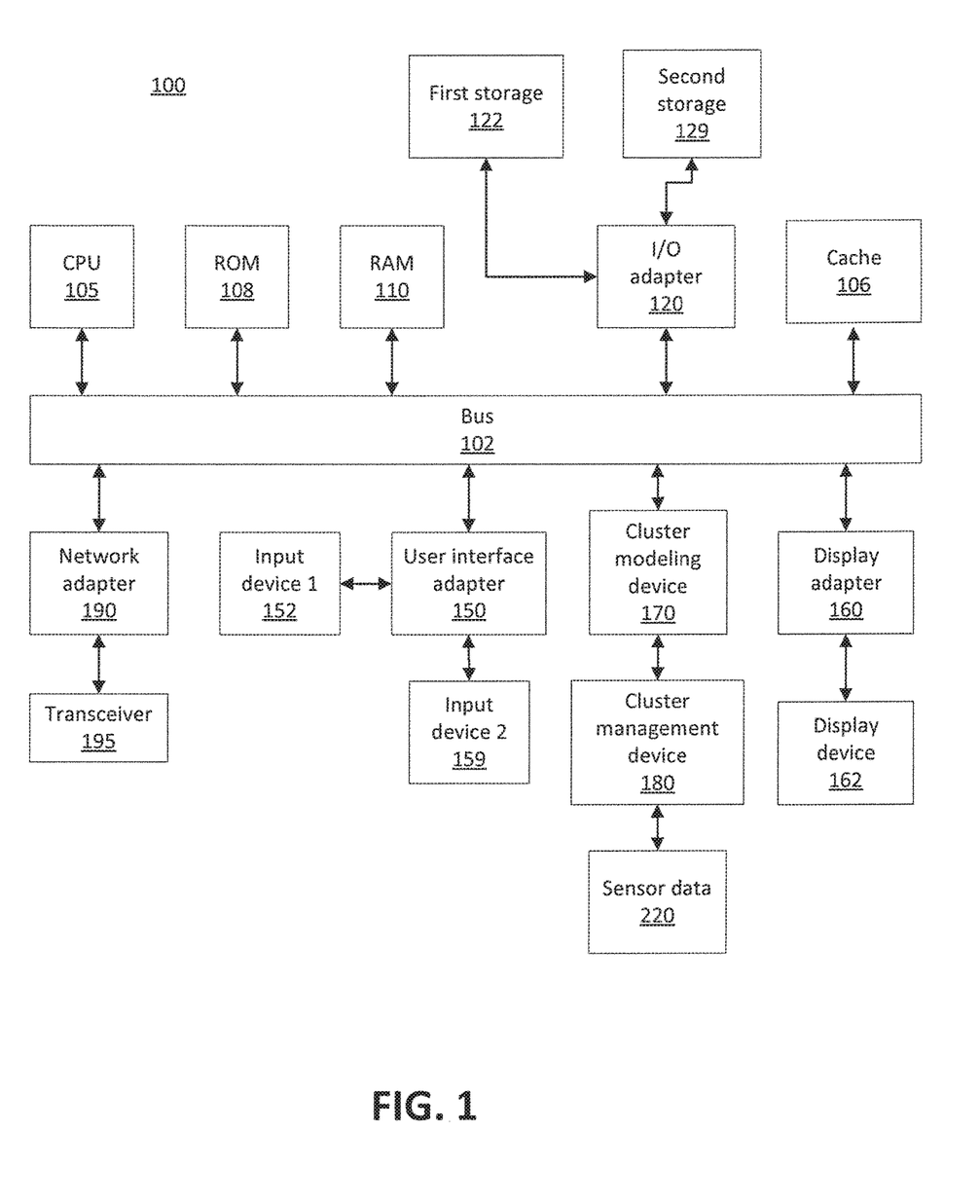
FIG. 1 is a schematic and block diagram illustrating a high-level system for clustered refrigeration showcase monitoring in accordance with an embodiment of the present invention.

Referring now in detail to the figures in which like numerals represent the same or similar elements and initially to FIG. 1, an exemplary computer system (e.g., a server or a network device) for anomaly detection for clustered showcases is shown in accordance with an embodiment of the present invention. The computer system 100 includes at least one processing device (CPU) 105 operatively coupled to other components via a system bus 102. A cache 106, a Read Only Memory (ROM) 108, a Random-Access Memory (RAM) 110, an input/output (I/O) adapter 120, a network adapter 190, a user interface adapter 150, a cluster modeling device 170, a cluster management device 180 and a display adapter 160, can be operatively coupled to the system bus 102.

A first storage device 122 and a second storage device 129 can be operatively coupled to system bus 102 by the I/O adapter 120. The storage devices 122 and 129 can be any of a disk storage device (e.g., a magnetic or optical disk storage device), a solid state magnetic device, and so forth. The storage devices 122 and 129 can be the same type of storage device or different types of storage devices. Either or both of the storage devices 122 and 129 can be configured to operate as a data store or database to store various logs of system events (e.g., heterogeneous logs). The cluster modeling device 170, and cluster management device 180 can include software and/or hardware as described herein below.

A transceiver 195 can be operatively coupled to system bus 102 by network adapter 190. A display device 162 is operatively coupled to system bus 102 by display adapter 660. Sensor data 220 can be operatively coupled to system bus 102 directly or indirectly, for example via cluster management device 180 and cluster modeling device 170. The cluster modeling device 170 can be configured to build refrigeration showcase clusters with corresponding table between the refrigeration showcases and sensors and information for showcase clustering, for example as described herein below with respect to FIG. 2. The cluster management device 180 can be configured to receive sensor data 220 (for example, in real time) and, for each cluster of refrigeration showcases, build a model, and then apply the model to the refrigeration showcases for monitoring, for example as described herein below with respect to FIG. 3. If anomaly is detected, the cluster management device 180 can generate an alert for users.

A first user input device 152 and a second user input device 159 can be operatively coupled to system bus 102 by user interface adapter 150. The user input devices 152 and 159 can be any of a sensor, a keyboard, a mouse, a keypad, a joystick, an image capture device, a motion sensing device, a power measurement device, a microphone, a device incorporating the functionality of at least two of the preceding devices, and so forth. Of course, other types of input devices can also be used in accordance with the present invention. The user input devices 152 and 159 can be the same type of user input device or different types of user input devices. The user input devices 152 and 159 can be used to input and output information to and from system 100.

Other embodiments of the present invention can optionally include further processing units including a graphics processing unit ("GPU"), a mother board, or alternatively/additionally another storage medium, an operating system, one or more application software, as well as including one or more communication interfaces (e.g., RS232, Ethernet, Wi-Fi, Bluetooth, USB). Useful examples of computing devices optionally included in or integrable with embodiments of the present invention include, but are not limited to, personal computers, smart phones, laptops, mobile computing devices, tablet PCs, and servers. In accordance with embodiments of the present invention, an event record log source can be a computer storage medium.

Of course, the computer system 100 can also include other elements (not shown), as readily contemplated by one of skill in the art, as well as omit certain elements. For example, various other input devices and/or output devices can be included in computer system 100, depending upon the particular implementation of the same, as readily understood by one of ordinary skill in the art. For example, various types of wireless and/or wired input and/or output devices can be used. Moreover, additional processors, controllers, memories, and so forth, in various configurations can also be utilized as readily appreciated by one of ordinary skill in the art. These and other variations of the computer system 100 are readily contemplated by one of ordinary skill in the art given the teachings of the present invention provided herein.

It should be understood that multiple computing devices can be operably linked to form a computer network in a manner as to distribute and share one or more resources, such as clustered computing devices and server banks/farms.

In embodiments of the present invention each of the aforementioned elements (e.g., device, medium, source, or module) can be directly or indirectly communicably connected (e.g., via a wireless a wired electronic connection) to at least one other element of the system. As described in more detail below, some embodiments of the present invention can be wholly contained within a single computing device. Other embodiments however, can encompass a plurality of interconnected or networked devices and resources.

Figure 2:
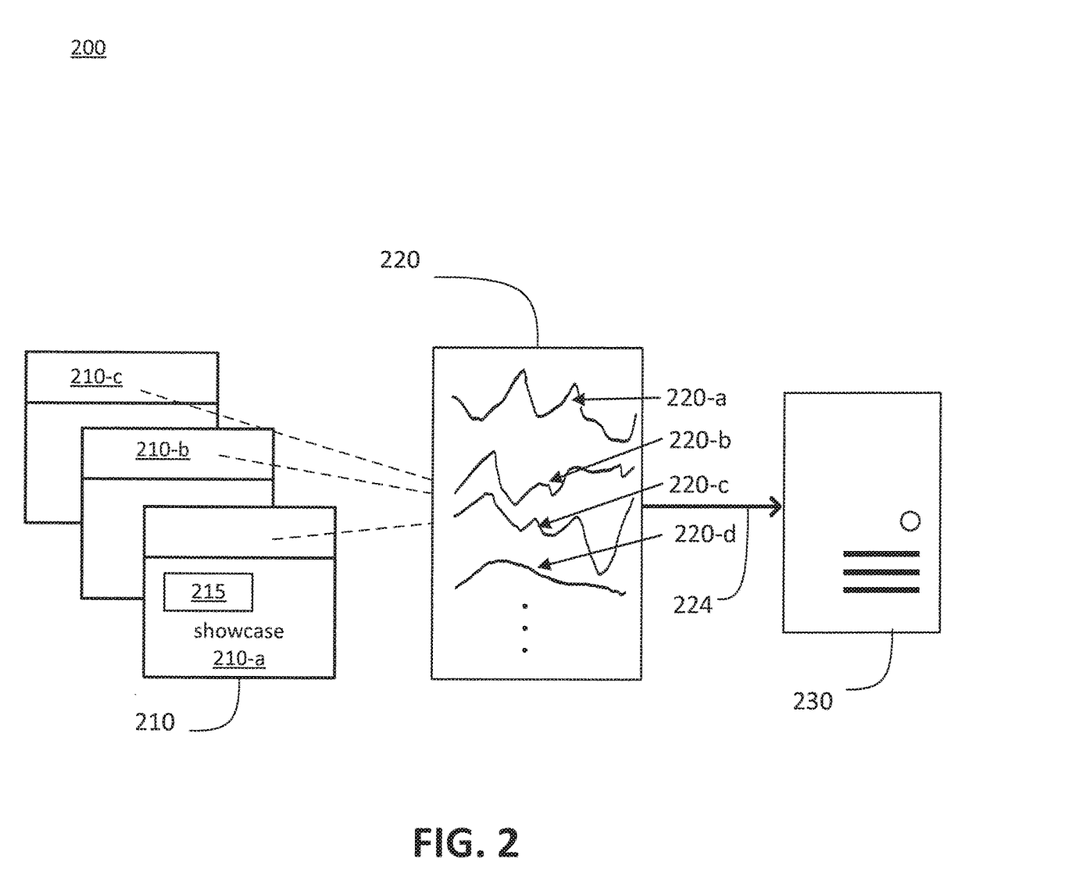
FIG. 2 is a block diagram illustrating a high-level system for clustered refrigeration showcase monitoring, in accordance with the present invention.

Referring now to FIG. 2, a system for clustered refrigeration showcase monitoring is illustratively depicted in accordance with an embodiment of the present invention.

As shown in FIG. 2, system 200 includes multiple showcases 210 (shown individually as 210-*a*, 210-*b* and 210-*c*, by way of example) and time series data 220 (shown individually as 220-*a*, 220-*b*, 220-*c* and 220-*d*, by way of example) generated by a sensor network 215 that receives data from the showcases 210. The showcases 210 may include refrigeration showcases, chillers, freezers and refrigerators and similar equipment deployed, for example, in retail stores or other commercial locations in which multiple cooling devices are deployed (for example, factories, medical laboratories, packaging facilities, abattoirs, etc.). As is shown by the different shapes of the time series data curves 220-*a* to 220-*d*, the variation in data from the sensors associated with the different showcases (and, in some instances, associated refrigeration units) can at times be large.

The refrigeration showcases in retail stores are affected by external environment and operations. In some instances, the external environment and operations causes large change in time series data 220 of sensors on showcases 210. This may increase the number of false positives (or the probability of false positives) when anomaly detection methods are applied. The cluster anomaly monitoring server 230 reduces the false positives by clustering (data from) the showcases 210 and applying analysis to the clustered showcases.

The cluster anomaly monitoring server 230 retrieves a data stream (selected, for example, from 220-*a* to 220-*d*) from each of the showcases 210 via the sensor network 215. For example, the sensor network 215 can provide sensor data 220 from sensors 215 embedded in each of the showcases 210 to the cluster anomaly monitoring server 230. The example embodiments described herein below are (for the most part) directed towards instances in which only showcases 210 are targeted for monitoring for purposes of simplicity and clarity of explanation. However, the example embodiments can be applied to other scenarios for monitoring equipment. For example, sensors on refrigerators and on the store (for example, heating, ventilation and air conditioning (HVAC) systems, freezers, etc.) can also be modeled together with those on showcases 210.

The cluster anomaly monitoring server 230 can log the sensor data 220, e.g., in a memory or storage device, or in a database. The sensor data 220 includes, for example, compressor frequency, temperature, electricity consumption, etc. The sensor data 220 including time series data 220-*a* to 220-*d* from each of the showcases 210 is input 224 into cluster anomaly monitoring server 230. Raw time series data from showcases is dynamic and noisy in general.

Cluster anomaly monitoring server 230 implements a fault detection process for clustered showcases 210 (rather than individual showcases). Cluster anomaly monitoring server 230 builds clusters of showcases 210 and then builds a model for each cluster with multi-variate time series data to learn data properties over normally running periods. At first, cluster anomaly monitoring server 230 builds a model with given multivariate time series data 220 as shown in FIG. 2. After building the model(s), cluster anomaly monitoring server 230 computes the score for abnormality in real time using given the latest observation in the time series, in a manner such as described herein below with respect to FIG. 3. Extracting the data from the clustered showcases 210 reduces the effect of noise on the anomaly detection process.

When building a model for clustered showcases from multi-variate time series, the cluster anomaly monitoring server 230 can use any data driven modeling which can model dependency between attributes such as long short-term memory (LSTM) auto-encoder, invariant relationships, and principal component analysis (PCA) based method, etc.

Figure 3:
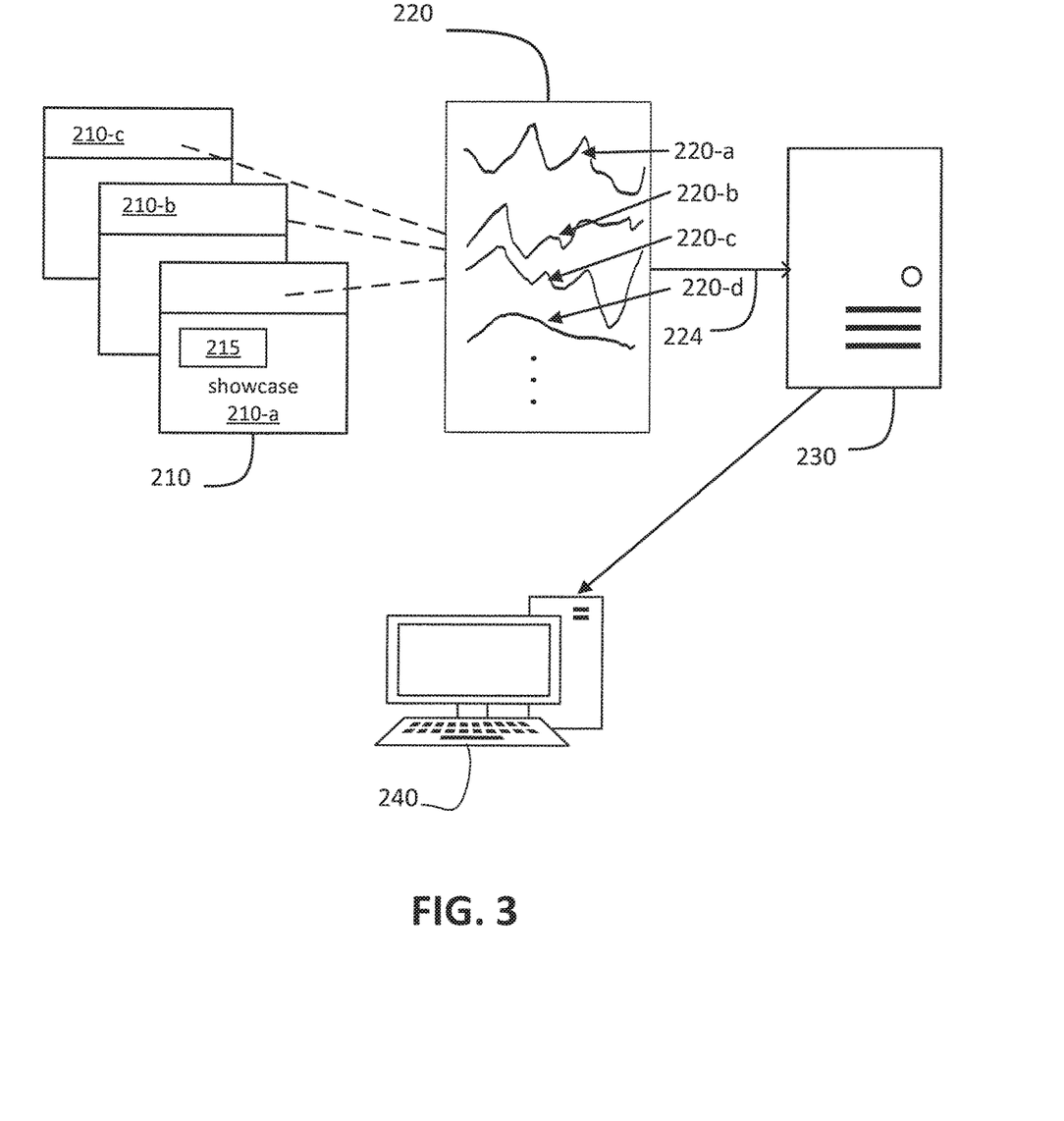
FIG. 3 is a block diagram illustrating a high-level system for clustered refrigeration showcase monitoring, in accordance with the present invention.

Referring now to FIG. 3, a system for clustered refrigeration showcase monitoring is illustratively depicted in accordance with an embodiment of the present invention.

Using a model for clustered refrigeration showcase monitoring, such as determined with respect to FIG. 2 herein above, cluster anomaly monitoring server 230 keeps monitoring system status by checking the reconstruction error from the model. Reconstruction error may be used for an auto-encoder (or similar), where the goal is either to reduce the dimensionality of the input then reconstruct the original input, or to take in noise-perturbed input and reconstruct original input. In instances in which the system status is normal, the reconstruction error is small. When the error goes large, the cluster anomaly monitoring server 230 detects system failure (for example, with respect to certain clusters of the clustered showcases 210) and gives alert to report the system failure.

If the error score is higher than a predetermined threshold, the cluster anomaly monitoring server 230 notifies its user through the client 240 that an anomaly happened at showcases 210. Given the notification, the user can call to a technician to fix the problem. In some instances, cluster anomaly monitoring server 230 can address faults by, for example, shutting down systems and equipment that are malfunctioning, as indicated by the fault, shutting down or resetting devices to prevent hazardous situations caused by or associated with the fault, dispatching maintenance teams, issuing alerts via the internet, email, simple messaging service (SMS) or other communication medium, or any other appropriate response to the fault.

If an anomaly is detected, cluster anomaly monitoring server 230 generates an alert for users. Cluster anomaly monitoring server 230 can analyze sensor data 220 to determine anomalous behavior. For such analysis, the cluster anomaly monitoring server 230 can determine behavior that does not match normal operating behavior of the refrigeration showcases 210 (for example, power consumption or temperature that is outside of a predetermined range, etc.).

Cluster anomaly monitoring server 230 can also provide ranking scores for sensors 215. Based on the ranking score, cluster anomaly monitoring server 230 can inform the user 240 as to which sensors 215 provide the most relevant information about the failure. In addition, the cluster anomaly monitoring server 230 can notify the user as to the location of the faulty showcase or identify the faulty component in the showcase. Additionally, cluster anomaly monitoring server 230 can provide estimate value(s) for each sensor 215. Cluster anomaly monitoring server 230 can thereby allow an end user 240 to visualize expected behavior in sensor 215 and actual behavior of sensor 215 concurrently. For example, the expected behavior and actual behavior may be displayed in graphical form on a user interface. The cluster anomaly monitoring server 230 can shorten the time to fix the issue with the refrigeration showcases 210 and thereby reduce power consumption, maintain the displayed goods at required temperatures, prevent spoilage, increase customer retention, etc.

Figure 4:
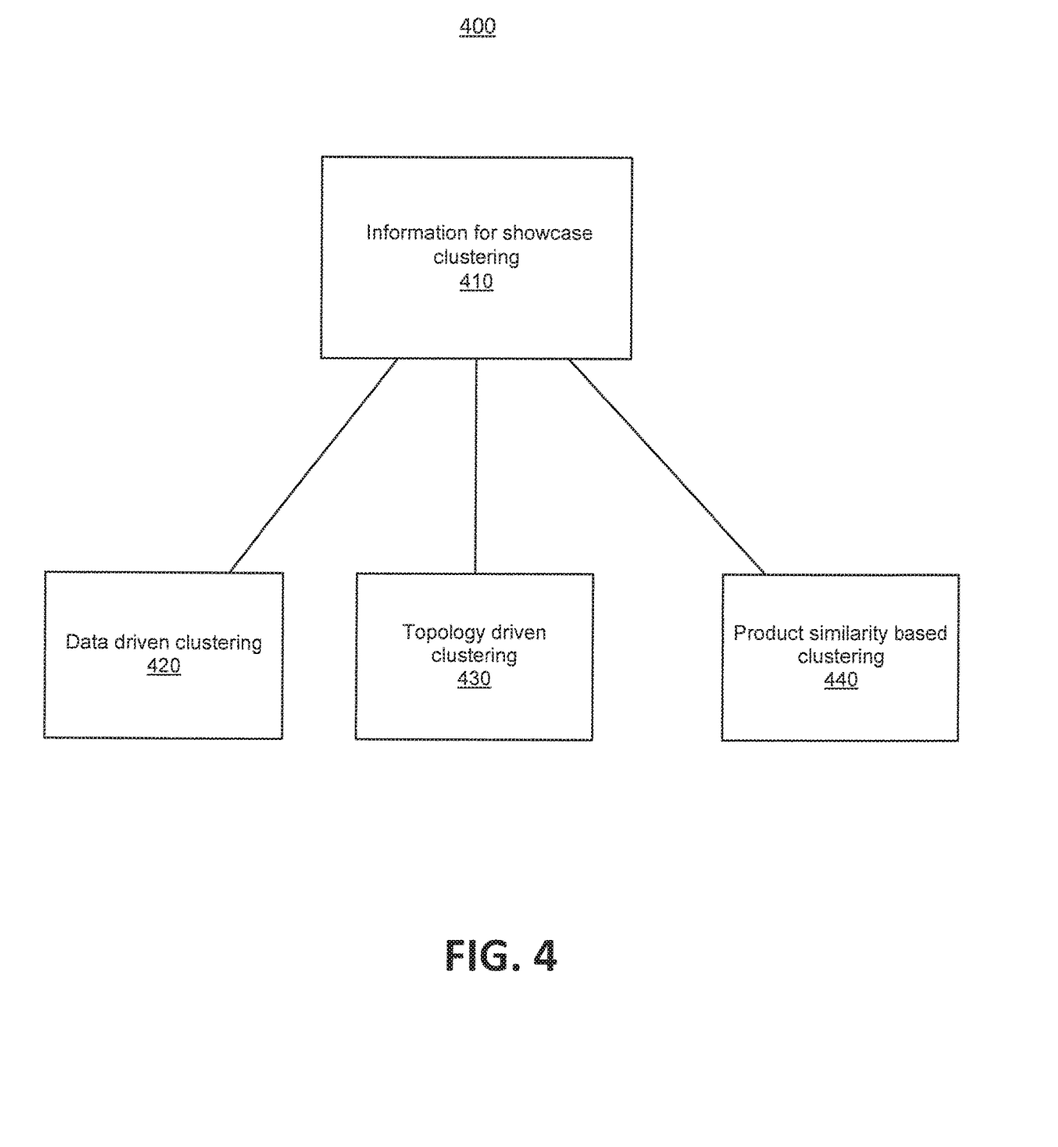
FIG. 4 is a diagram illustrating information elements for showcase clustering, in accordance with the present invention.

Referring now to FIG. 4, information elements 400 for clustered refrigeration showcase monitoring are illustratively depicted in accordance with an embodiment of the present invention.

The information elements 400 can be stored by cluster anomaly monitoring server 230 in an associated data storage (for example, first storage device 122 and a second storage device 129, as described herein above with respect to FIG. 1) and then accessed for use in clustered refrigeration showcase monitoring.

Appropriate clustering of showcases increases the accuracy of anomaly detection. To reduce influence from noise, dynamics (for example, regular fluctuations in the data, non-linear behavior that is not attributable to a fault, etc.) or both in time series data 220, cluster anomaly monitoring server 230 uses information for showcase clustering 410 that implies similarity or dependency between showcases 210. Considering only similar or dependent showcases 210 together, cluster anomaly monitoring server 230 can reduce uncertainty of the model and find robust features for anomaly detection among the showcases 210. As a result, cluster anomaly monitoring server 230 can reduce influence from noise, dynamics or both in time series data. The information for showcase clustering 410 can be classified (or further stored, accessed, etc.) according to several options.

Data driven clustering 420 builds showcase clusters based on multiple or single time series. In particular, temperature in the showcase can be good candidate for clustering since temperature in the showcase reflect showcase's property and usage directory. Cluster anomaly monitoring server 230 can apply general time series clustering technique. For example, cluster anomaly monitoring server 230 makes a correlation matrix and then applies a clustering algorithm, for example spectral clustering, to the correlation matrix.

Topology driven clustering 430 builds showcase clusters based on connectivity of showcases 210. In a store, each showcase 210 is connected to one of the refrigerators in a store. With this information on connectivity, cluster anomaly monitoring server 230 builds showcase clusters (based on the topology of the refrigerators and showcases in the store). For example, when a refrigerator is connected to three showcases 210, a cluster consists of those three showcases.

Product similarity-based clustering 440 builds showcase clusters based on model number of the product. If the products in the showcases 210 are same or relevant/related, cluster anomaly monitoring server 230 identifies a cluster consisting of those showcases 210.

Cluster anomaly monitoring server 230 builds a model for each showcase cluster. Cluster anomaly monitoring server 230 can build a model for a showcase cluster from attributes which spatially belongs to one of the showcases 210 in the cluster. There is no overlap in terms of the sensors among different showcase cluster models. However, attributes which are not unique for a showcase 210 can be shared among those showcase cluster models. For example, attributes such as temperature in the store, humidity in the store, sensor readings on refrigerators, etc., can be shared among different showcase cluster models.

Figure 5:
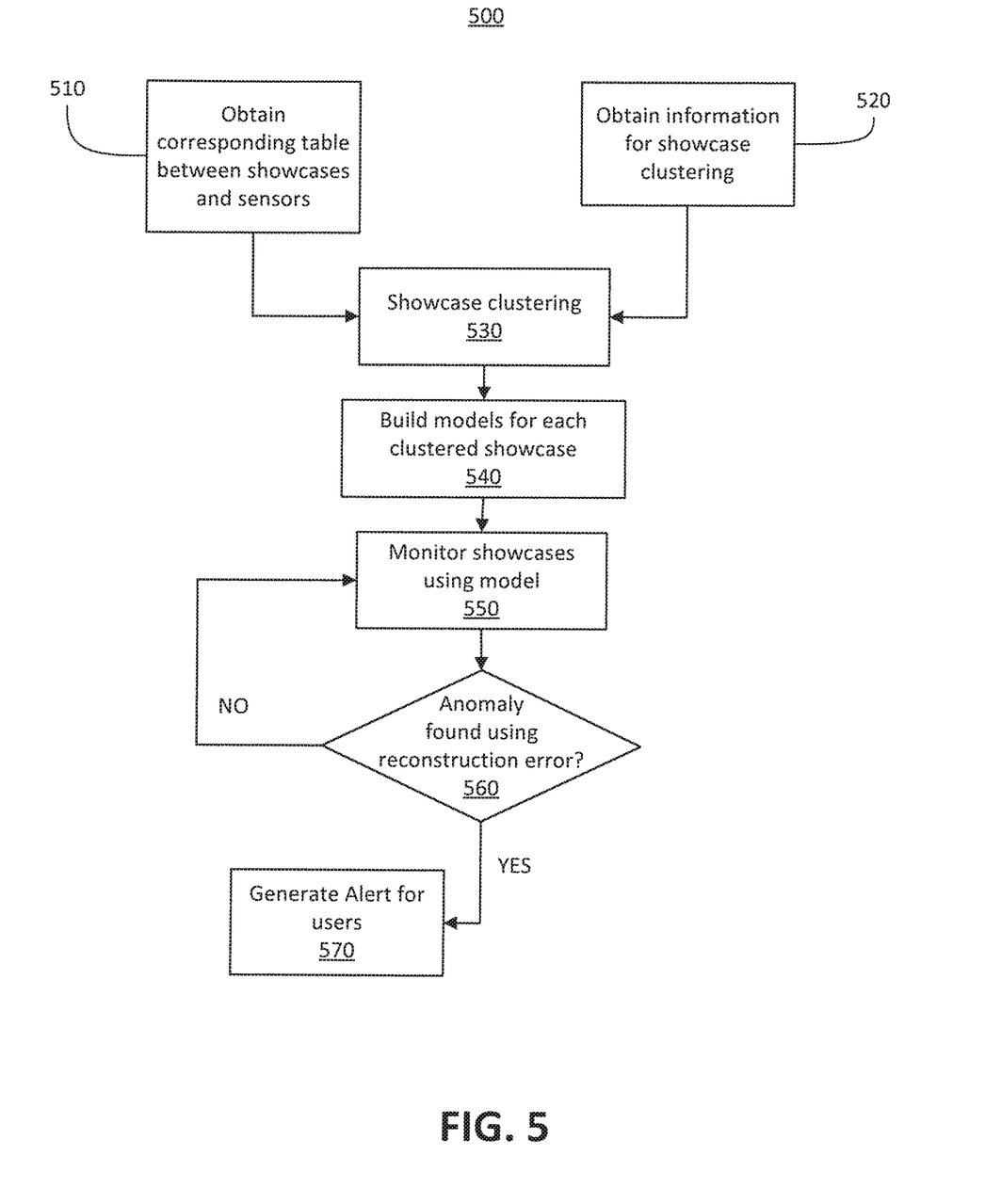
FIG. 5 is a flow diagram illustrating a method for clustered refrigeration showcase monitoring, in accordance with the present invention.

Referring now to FIG. 5, a method 500 for clustered refrigeration showcase monitoring is illustratively depicted in accordance with an embodiment of the present invention.

At block 510, cluster anomaly monitoring server 230 obtains a corresponding table between showcases 210 and sensors 215. The table can identify which of the sensors 215 are associated with each showcase 210.

At block 520, cluster anomaly monitoring server 230 obtains information for showcase clustering 410. The information includes, for example, time series data of temperature in showcases 210. The information can include data driven clustering 420 information, topology driven clustering 430, and product similarity-based clustering 440, such as described herein above with respect to FIG. 4.

At block 530, cluster anomaly monitoring server 230 performs showcase clustering based on the information for showcase clustering 410 and the corresponding table between showcases 210 and sensors 215.

At block 540, cluster anomaly monitoring server 230 can build models for each clustered showcase 210 with multi-variate time series data to learn data properties over normally running periods. According to an embodiment, cluster anomaly monitoring server 230 receives historical information regarding the identified showcases 210. According to another embodiment, cluster anomaly monitoring server 230 receives multi-variate time series data regarding the performance of showcases 210 from different locations as well as additional information regarding the particular locations, such as a local temperature/weather, a time of day at which the data is measured, seasonal information, new product introduction times, etc. The model can also incorporate information regarding the reliability of a power supply (for example, brownouts or blackouts). Cluster anomaly monitoring server 230 can thereby expand the model to include a real-time or near real-time view of the expected behavior of customers and other factors, such as a power supply.

At block 550, cluster anomaly monitoring server 230 monitors showcases 210 using the model built for each cluster. Cluster anomaly monitoring server 230 may store the models with the identified showcase clusters.

At block 560, cluster anomaly monitoring server 230 determines whether an anomaly is found using reconstruction error (based on the model). If cluster anomaly monitoring server 230 does not detect any anomalies (anomaly found using reconstruction error? No), cluster anomaly monitoring server 230 continues monitoring (block 550).

At block 570, if cluster anomaly monitoring server 230 detects an anomaly (anomaly found using reconstruction error? Yes), cluster anomaly monitoring server 230 generates an alert for users. Alternatively, cluster anomaly monitoring server 230 may implement an action to correct the anomaly or mitigate for conditions caused by the anomaly. For example, cluster anomaly monitoring server 230 may reduce the temperature of other refrigerating units or redirect refrigeration (for example, opening or closing movable vents, in some instances as a temporary measure) in response to detecting an anomaly.

Embodiments described herein can be entirely hardware, entirely software or including both hardware and software elements. In a preferred embodiment, the present invention is implemented in software, which includes but is not limited to firmware, resident software, microcode, etc.

Embodiments can include a computer program product accessible from a computer-usable or computer-readable medium providing program code for use by or in connection with a computer or any instruction execution system. A computer-usable or computer readable medium can include any apparatus that stores, communicates, propagates, or transports the program for use by or in connection with the instruction execution system, apparatus, or device. The medium can be magnetic, optical, electronic, electromagnetic, infrared, or semiconductor system (or apparatus or device) or a propagation medium. The medium can include a computer-readable storage medium such as a semiconductor or solid-state memory, magnetic tape, a removable computer diskette, a random access memory (RAM), a read-only memory (ROM), a rigid magnetic disk and an optical disk, etc.

Each computer program can be tangibly stored in a machine-readable storage media or device (e.g., program memory or magnetic disk) readable by a general or special purpose programmable computer, for configuring and controlling operation of a computer when the storage media or device is read by the computer to perform the procedures described herein. The embodiments of the present inventive system can also be considered to be embodied in a computer-readable storage medium, configured with a computer program, where the storage medium so configured causes a computing device (e.g., computer) to operate in a specific and predefined manner to perform the functions described herein.

A data processing system suitable for storing and/or executing program code can include at least one processor coupled directly or indirectly to memory elements through a system bus. The memory elements can include local memory employed during actual execution of the program code, bulk storage, and cache memories which provide temporary storage of at least some program code to reduce the number of times code is retrieved from bulk storage during execution. Input/output or I/O devices (including but not limited to keyboards, displays, pointing devices, etc.) can be coupled to the system either directly or through intervening I/O controllers.

Network adapters can also be coupled to the system to enable the data processing system to become coupled to other data processing systems or remote printers or storage devices through intervening private or public networks. Modems, cable modem and Ethernet cards are just a few of the currently available types of network adapters.

The foregoing is to be understood as being in every respect illustrative and exemplary, but not restrictive, and the scope of the invention disclosed herein is not to be determined from the Detailed Description, but rather from the claims as interpreted according to the full breadth permitted by the patent laws. It is to be understood that the embodiments shown and described herein are only illustrative of the present invention and that those skilled in the art may implement various modifications without departing from the scope and spirit of the invention. Those skilled in the art could implement various other feature combinations without departing from the scope and spirit of the invention. Having thus described aspects of the invention, with the details and particularity required by the patent laws, what is claimed and desired protected by Letters Patent is set forth in the appended claims.

What is claimed is:

1. A method for failure prevention and mitigation of a plurality of showcases in a structure based on detecting anomalies in the plurality of showcases, comprising:

receiving a data stream from a sensor network including a plurality of sensors embedded in the plurality of showcases and a plurality of external environmental sensor disposed on heating, ventilation, and air conditioning (HVAC) system components in the structure and obtaining a corresponding table between each of the plurality of showcases, each of the HVAC components, and at least one corresponding sensor selected from the plurality of sensors, and at least one external environmental sensor;

obtaining information for showcase and HVAC system component clustering;

determining, by a processor device, at least one cluster of showcases and HVAC system components based on the information for showcase and HVAC system component clustering and the corresponding table between each of the plurality of showcases, each of the HVAC components, the at least one corresponding sensor selected from the plurality of sensors, and the at least one external environmental sensor;

building at least one model for each of the at least one cluster of showcases and HVAC system components based on historical performance data of the plurality of showcases, performance data for showcases from at least one different location, expected customer behavior, and additional data related to the structure, the additional data including a time of day at which the data stream is measured and seasonal location information; and detecting at least one anomaly based on data from the at least one cluster of showcases and HVAC system components and the at least one model; and automatically mitigating faults identified by the at least one anomaly by redirecting refrigeration or shutting down one or more devices in the at least one cluster associated with the at least one anomaly upon detection of the at least one anomaly.

2. The method as recited in claim 1, wherein detecting the at least one anomaly further comprises:
determining whether the at least one anomaly is found in data from the at least one cluster using reconstruction error of the at least one model.

3. The method as recited in claim 1, further comprising:
generating an alert in response to detecting the at least one anomaly.

4. The method as recited in claim 1, further comprising:
implementing an action to correct the at least one anomaly in response to detecting the at least one anomaly.

5. The method as recited in claim 1, wherein the information for showcase and HVAC system component clustering implies at least one of similarity or dependency between each showcase or HVAC system component in the at least one cluster of showcases and HVAC system components.

6. The method as recited in claim 1, wherein building the at least one model further comprises:
building the at least one model to model dependency between attributes of the at least one cluster of showcases and HVAC system components.

7. The method as recited in claim 1, wherein detecting the at least one anomaly further comprises:
monitoring the at least one cluster of showcases and HVAC system components based on the at least one model; and
generating ranking scores for the plurality of sensors embedded in the plurality of showcases and the plurality of external environmental sensors disposed on HVAC system components, the ranking scores indicating which of the plurality of sensors embedded in the plurality of showcases and the plurality of external environmental sensors disposed on HVAC system components provide a most relevant information regarding the faults.

8. The method as recited in claim 1, wherein the information for showcase and HVAC system components clustering comprises at least one of:
data driven clustering information;
topology driven clustering information; or
product similarity-based clustering information.

9. The method as recited in claim 1, wherein building the at least one model for each of the at least one cluster of showcases and HVAC system components further comprises applying at least one of:
a long short-term memory (LSTM) auto-encoder,
invariant relationships, and
a principal component analysis (PCA) based method.

10. The method as recited in claim 1, wherein the data from the at least one cluster of showcases and HVAC system components further comprises:
multi-variate time series data.

11. The method as recited in claim 1, further comprising:
sharing at least one non-unique attribute among the at least one model.

12. A computer system for failure prevention and mitigation of a plurality of showcases in a structure based on detecting anomalies in the plurality of showcases, comprising:
a processor device operatively coupled to a memory device, the processor device being configured to:
receive a data stream from a sensor network including a plurality of sensors embedded in the plurality of showcases and a plurality of external environmental sensors disposed on heating, ventilation, and air conditioning (HVAC) system components in the structure and obtain a corresponding table between each of the plurality of showcases, each of the HVAC components, at least one corresponding sensor selected from the plurality of sensors, and at least one external environmental sensor;
obtain information for showcase and HVAC system component clustering;
determine at least one cluster of showcases and HVAC system components based on the information for showcase and HVAC system component clustering and the corresponding table between each of the plurality of showcases, each of the HVAC components, the at least one corresponding sensor selected from the plurality of sensors, and the at least one external environmental sensor;
build at least one model for each of the at least one cluster of showcases and HVAC system components; and
detect at least one anomaly based on data from the at least one cluster of showcases and HVAC system components and the at least one model based on historical performance data of the plurality of showcases, performance data for showcases from at least one different location, expected customer behavior, and additional data related to the structure, the additional data including a time of day at which the data stream is measured and seasonal location information; and
automatically mitigate faults identified by the at least one anomaly by redirecting refrigeration or shutting down one or more devices in the at least one cluster associated with the at least one anomaly upon detection of the at least one anomaly.

13. The system as recited in claim 12, wherein, when detecting the at least one anomaly, the processor device is further configured to:
determine whether the at least one anomaly is found in data from the at least one cluster using reconstruction error of the at least one model.

14. The system as recited in claim 12, wherein the processor device is further configured to:
generate an alert in response to detecting the at least one anomaly.

15. The system as recited in claim 12, wherein the processor device is further configured to:
  implement an action to correct the at least one anomaly in response to detecting the at least one anomaly.

16. The system as recited in claim 12, wherein the information for showcase and HVAC system component clustering implies at least one of similarity or dependency between each showcase or HVAC system component in the at least one cluster of showcases and HVAC system components.

17. The system as recited in claim 12, wherein, when building the at least one model, the processor device is further configured to:
  build the at least one model to model dependency between attributes of the at least one cluster of showcases and HVAC system components.

18. The system as recited in claim 12, wherein, when detecting the at least one anomaly, the processor device is further configured to:
  monitor the at least one cluster of showcases and HVAC system components based on the at least one model; and
  generating ranking scores for the plurality of sensors embedded in the plurality of showcases and the plurality of external environmental sensors disposed on HVAC system components, the ranking scores indicating which of the plurality of sensors embedded in the plurality of showcases and the plurality of external environmental sensors disposed on HVAC system components provide a most relevant information regarding the faults.

19. The system as recited in claim 12, wherein the information for showcase and HVAC system components clustering comprises at least one of:
  data driven clustering information;
  topology driven clustering information; or
  product similarity-based clustering information.

20. A computer program product for failure prevention and mitigation of a plurality of showcases in a structure based on detecting anomalies in the plurality of showcases, the computer program product comprising a non-transitory computer readable storage medium having program instructions embodied therewith, the program instructions executable by a computing device to cause the computing device to perform the method comprising:
  receiving a data stream from a sensor network including a plurality of sensors embedded in the plurality of showcases and a plurality of external environmental sensors disposed on heating, ventilation, and air conditioning (HVAC) system components in the structure and obtaining a corresponding table between each of the plurality of showcases, each of the HVAC components, at least one corresponding sensor selected from the plurality of sensors, and at least one external environmental sensor;
  obtaining information for showcase and HVAC system component clustering;
  determining, by a processor device, at least one cluster of showcases and HVAC system components based on the information for showcase and HVAC system component clustering and the corresponding table between each of the plurality of showcases, each of the HVAC components, the at least one corresponding sensor selected from the plurality of sensors, and the at least one external environmental sensor;
  building at least one model for each of the at least one cluster of showcases and HVAC system components based on historical performance data of the plurality of showcases, performance data for showcases from at least one different location, expected customer behavior, and additional data related to the structure, the additional data including a time of day at which the data stream is measured and seasonal location information;
  detecting at least one anomaly based on data from the at least one cluster of showcases and HVAC system components and the at least one model; and
  automatically mitigating faults identified by the at least one anomaly by shutting down one or more devices in the at least one cluster associated with the at least one anomaly upon detection of the at least one anomaly.

* * * * *